United States Patent [19]

Ishikawa et al.

[11] 4,450,475

[45] May 22, 1984

[54] SOLID STATE COLOR IMAGING APPARATUS

[75] Inventors: Kiyotsugu Ishikawa, Takatsuki; Yoshiaki Sone, Toyonaka; Susumu Hashimoto, Moriyama; Masanori Ōmae, Nagaokakyo; Takao Kunii, Amagasaki, all of Japan

[73] Assignee: Matsushita Electric Industrial Co., Ltd., Kadoma, Japan

[21] Appl. No.: 346,152

[22] Filed: Feb. 5, 1982

[30] Foreign Application Priority Data

Feb. 10, 1981 [JP] Japan .................................. 56-18789

[51] Int. Cl.³ .............................................. H04N 9/07
[52] U.S. Cl. ...................................................... 358/44
[58] Field of Search .......................................... 358/44

[56] References Cited

U.S. PATENT DOCUMENTS 4,282,547 8/1981 Morishita ............................. 358/44

Primary Examiner—John C. Martin
Assistant Examiner—Michael D. Parker
Attorney, Agent, or Firm—Cushman, Darby & Cushman

[57] ABSTRACT

Solid state color imaging apparatus comprises a solid state photoelectric device such as an interline type CCD having a color filter in front of it. The color filter has a number of minute filter elements disposed forming vertical column and at the same time horizontal rows, each vertical column comprising repetition of transparent element, cyanic element, transparent and yellow element each odd number horizontal rows, comprising repetition of transparent element and yellow element, each even number horizontal rows comprising repetition of transparent element and cyanic element, and in two-dimensional disposition the transparent elements are disposed in chequered pattern.

7 Claims, 7 Drawing Figures

FIG.1 (General)

FIG. 2 (Prior Art)

| W | Cy | W | Cy | | nH |
|---|----|---|----|---|-----|
| W | Cy | W | Cy | | nH' |
| Ye | W | Ye | W | | (n+1)H |
| Ye | W | Ye | W | | (n+1)H' |

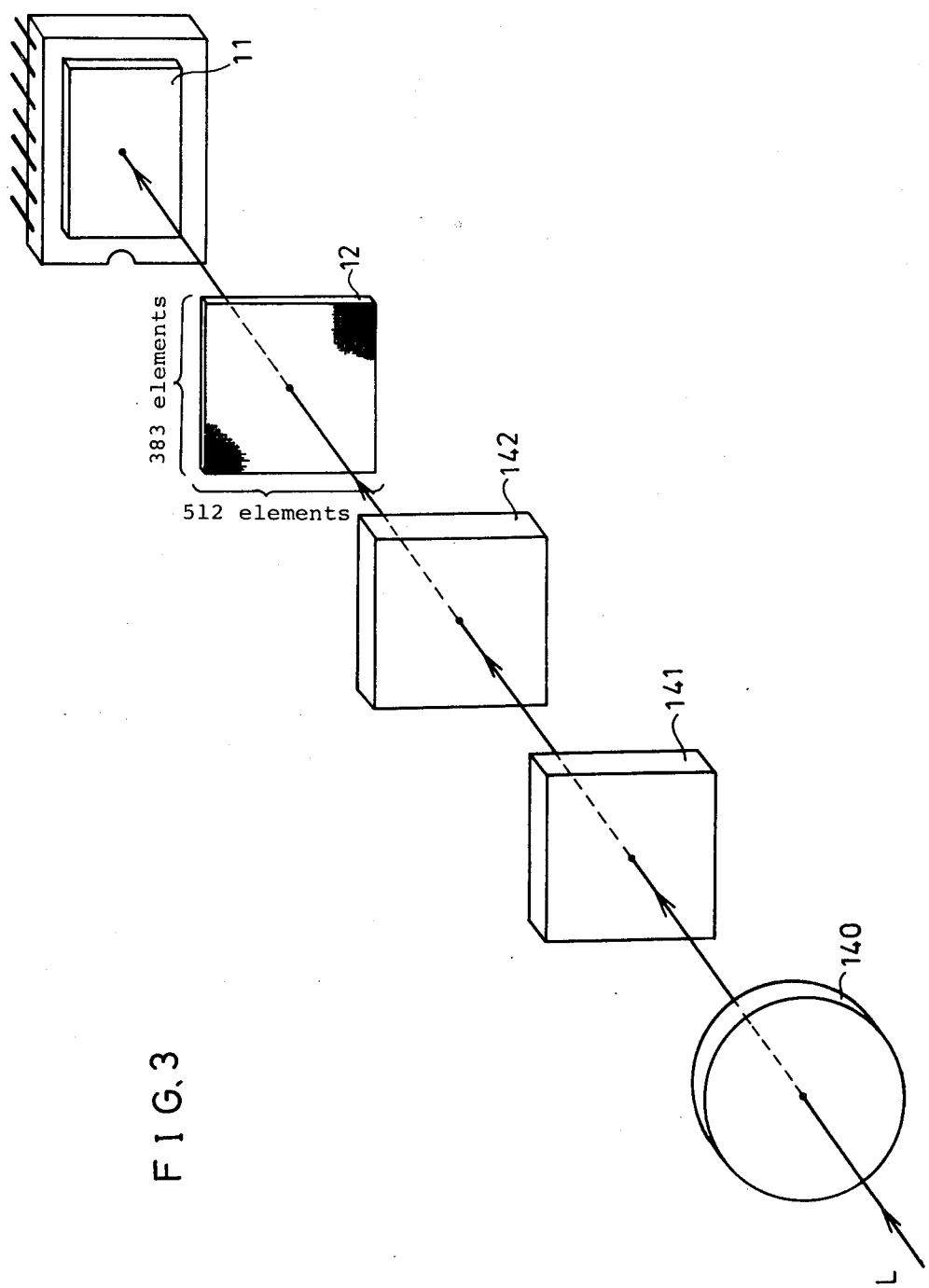
F I G. 3

SOLID STATE COLOR IMAGING APPARATUS

BACKGROUND OF THE INVENTION

1. Field of the Invention

The present invention relates to an improvement of a solid state color image pick-up apparatus provided with minute color filters in front of the light receiving face thereof to pick-up color images.

2. Description of Prior Arts

Solid-state pick-up device made as a CCD, BBD, MOS device or hybrid devices thereof, which has a novel characteristic which is not possessed by the conventional picture pick-up tubes is making rapid development. The solid state apparatus, on top of smallness and light weight, low power consumption, high reliability and long life, has advantages of having no burning by image on photoelectric face and no distortion of image pattern. Accordingly, the device recently comes into wide uses in remote monitoring, application in a distance measuring, or in color television cameras using three chips, two chips or single chip. Besides, the solid state apparatus does not make distortion of pattern due to environmental magnetic field and electric field, and hence is possible to make precise measurement of position and length. In making a two-chip or single chip type color image pick-up camera, filter is bonded in front of the chip to produce separate color signals thereby; in such case, the positions of the respective colors of filter are obtained by electric means, since there is no pattern distortion like the case of conventional pick-up tube utilizing electromagnetic deflections; and therefore, the separation of color signal is possible without a particular index signal or a particular processing of signal.

It is known that, in order to make a color image pick-up camera with a single chip, a filter 12 having an array of color filter elements to correspond to picture elements of a solid state device 11 is bonded in front of the solid state device, as shown in FIG. 1, which schematically shows only a small fraction of the picture elements and corresponding filters, wherein $C_{11}$, $C_{12}$, $C_{13}$ ..., $C_{11}'$, $C_{12}'$, $C_{13}'$ ..., $C_{21}$, $C_{22}$, $C_{23}$ ... $C_{21}'$, $C_{22}'$ ... $C_{44}$ ... designate filter elements of the filter 12 to be disposed in front of the picture elements $A_{11}$, $A_{12}$, $A_{13}$ ..., $A_{11}'$, $A_{12}'$, $A_{13}'$ ..., $A_{21}$, $A_{22}$, $A_{23}$ ..., $A_{21}'$, $A_{22}'$ ..., respectively of the solid state device. A color image pick-up camera is constituted in a manner that signal of the above-mentioned solid state device are then sampled or detected thereby to separate luminance signal component and chrominance signal component therefrom. In the filter 12, the filter elements of the rows $C_{11}$, $C_{12}$, $C_{13}$ ..., $C_{21}$, $C_{22}$, $C_{23}$ ... are for the first field of the interlaced scanning video picture and the filter elements of the rows $C_{11}'$, $C_{12}'$, $C_{13}'$ ... and $C_{21}'$, $C_{22}'$, $C_{23}'$ ... are for the second field of the interlaced scanning video picture.

In the conventional color image pick-up camera of the above-mentioned constitution, the element color filters $C_{11}$, $C_{12}$, $C_{13}$, $C_{11}'$, $C_{12}'$, $C_{13}'$ ..., $C_{44}'$ have been constituted principally with primary colors, for example, red, blue and green, and therefore efficiency of light utility has been poor. This is because, for example, the green filter elements substantially cut off other component of light, namely red component and blue component, and so on. Generally speaking, from the view point of the light utility efficiency, transparent filters are highest, a complementary color filters next and primary color filters last.

Another prior art is described in the U.S. patent application Ser. No. 235,428 (corresponding to European Patent Application No. 81101089.1 first published unexamined on Aug. 26, 1981 under the publication number 0034361), gist of an exemplary embodiment of which is shown in FIG. 2, wherein in a horizontal row nH, (n+1)H, ... are for the first field and the horizontal row nH', (n+1)H', ... are for the second field. For each field, a horizontal row having filter elements of W-Cy-W-Cy ... (wherein W means transparent and Cy means cyanic) and another horizontal row having filter elements of Ye-W-Ye-W ... (wherein Ye means yellow) are alternately disposed from the top to the bottom. Since this apparatus is constructed with transparent (W) elements and complementary color (Cy & Ye) elements, the light utilization efficiency is high, and therefore, high sensitivity solid state image senser is obtainable. However, the conventional apparatus of FIG. 2 has a problem that resolving power is different between in the horizontal direction and in the vertical direction of the picture. That is, in the apparatus the vertical resolving power is only 50% of the horizontal resolving power. This is because in the vertical direction, two cyanic filter elements as well as two yellow filter elements are disposed in vertical sequence for height of two picture elements or two horizontal rows, while in the horizontal direction are cyanic elements as well as one yellow filter elements is disposed alternately with one transparent filter element.

SUMMARY OF THE INVENTION

The present invention purposes to provide an improved solid state color imaging apparatus wherein on top of high light utility efficiency, high resolving power is obtainable both in vertical direction and in horizontal direction.

The solid state color imaging apparatus in accordance with the present invention comprises a solid state photoelectric device and a color filter disposed in front thereof, which has a number of minute filter elements of transparent elements, a first complementary color elements and a second complementary color elements, the element corresponding to picture elements, the transparent elements being disposed in a chequered pattern.

BRIEF EXPLANATION OF THE DRAWING

FIG. 2 is a schematical front view of a small part of a conventional solid state color imaging apparatus.

FIG. 3 is an exploded perspective view of an actual example apparatus embodying the present invention.

DESCRIPTION OF THE PREFERRED EMBODIMENTS

Figure 1:
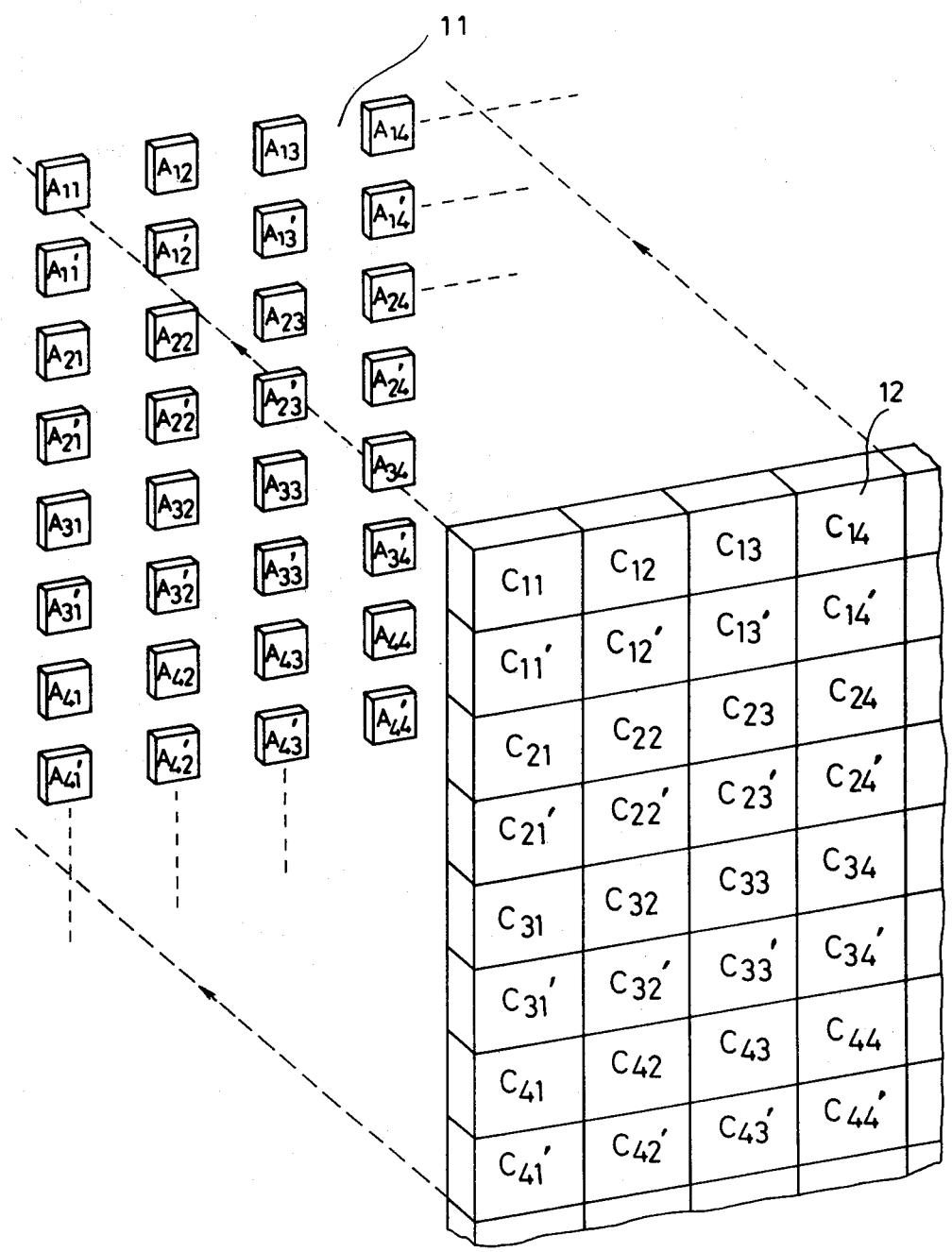
FIG. 1 is a schematical perspective view showing a relation between filter elements and the picture elements of a general solid state color imaging apparatus.

FIG. 3 is an exploded perspective view showing structure of an example for use in an ordinary TV system. A light L from object passes through a lens 140, a quartz filter 141, infrared light cut-off filter 142 and the filter 12 in accordance with the present invention, and is focused on the photoelectric device 11 which is, for example, constructed as an interline type CCD device. In practical structure, the filter 12 is bonded on a interline type CCD device 11, which has 383 picture elements in each horizontal row and has 512 horizontal rows in vertical direction, that is, 383×512 picture elements. The filter 12 has the structure, as shown by its one small part in FIG. 4(a), wherein n-th line and (n+1)-th line are for the first field and n'-th line and (n+1)'-th line are for the second field, respectively of the interlace scanning. In the filter face, the parts denoted as W are transparent, the elements denoted as Cy are cyanic colored and the elements denoted as Ye are yellow colored. That is to say, this filter has two kinds horizontal rows, namely W-Ye rows and W-Cy rows, every two rows in the vertical direction the two kinds of lines are alternatingly repeated. And that the transparent elements W are disposed in chequered relation.

In the present invention, in accordance with the ordinary use of the technical terms in the field of color television technology, the words "elementary colors" are used to mean the elementary colors of light, for example, red, green and blue; and the words "complementary colors" are used to mean the complementary colors against the elementary colors of light; therefore the "complementary colors" for the above-mentioned elementary colors red, green and blue are

- cyanic—is against the elementary color red, passes green and blue lights,
- magenta—is against the elementary color green and passes red and blue, and
- yellow—is against the elementary color blue and passes red and green lights.

Therefore, it is to be noted that, in the present invention, the words "complementary colors" imply the above-mentioned particular complementary colors instead of general contents of the same words. In the present invention, R, G, B, Cy and Ye imply red, green, blue, cyanic and yellow, respectively.

Figure 4A:
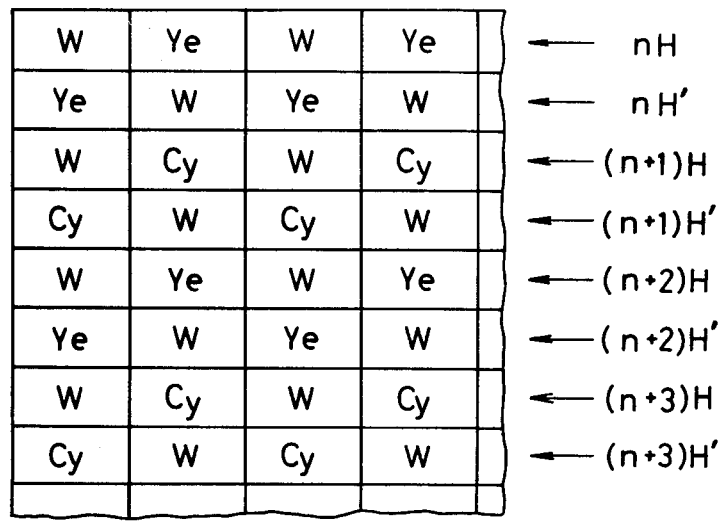
FIG. 4(a) is a schematical front view of a small part of an example of filter of a solid state color imaging apparatus in accordance with the present invention.

FIG. 4(a) schematically shows a small part of one example of disposition of filter elements of the present invention. In the first horizontal rows nH and nH' for the first field and the second field, respectively, consist of yellow filter elements Ye and transparent parts W, and the second horizontal rows (n+1)H and (n+1)H' for the first and the second field, respectively, consist of cyanic filter elements Cy and transparent parts, and the odd number rows for the first field and the second field are disposed in the repetition of the same filter elements. The even number rows for the first field and the second field are disposed in the repetition of same filter elements. And the rows for the second field nH', (n+1)H', (n+2)H' . . . are disposed with half pitch displacement from the rows for the first field nH, (n+1)H, (n+2)H, . . . respectively. That is, the transparent parts W are disposed in chequered pattern.

When the filter element disposition is seen in the vertical column, each vertical column has the filter element disposition of repetitions of the elements W-Ye-W-Cy. And the columns are disposed with respect to horizontal direction in a manner that the elements W are disposed in chequered relation and that a pair of two neighboring horizontal rows have W and Ye and the next pair of two neighboring horizontal rows have W and Cy.

As a result of the above-mentioned disposition of the filter elements, the transparent parts W, which are disposed in chequered relation, appear every two picture elements in the vertical direction, therefore the vertical resolving power of the apparatus is doubled in comparison with the conventional apparatus shown in FIG. 2. The apparatus of FIG. 4 has the same resolving powers in the horizontal direction and in the vertical direction for every colors. This is achieved by avoiding an occurrence that two color filter elements of the same color are disposed neighboring in vertical direction like in FIG. 2, and that in the horizontal direction two different filters for example W-Ye are disposed in a manner that the same color ones do not neighbor.

Both the cyanic filter elements Cy and yellow filter elements Ye passes green light component G, which is principal component of luminance signal Y as shown by the known formula:

$$Y = 0.59G + 0.30R + 0.11B.$$

Therefore the present apparatus produces luminance information from all the picture elements, resulting in improving the resolving power of the apparatus.

Furthermore, by disposing a considerable number of transparent parts, W which passes all the light components of red (R), green (G) and blue (B), the light utility efficiency is high.

Figure 4B:
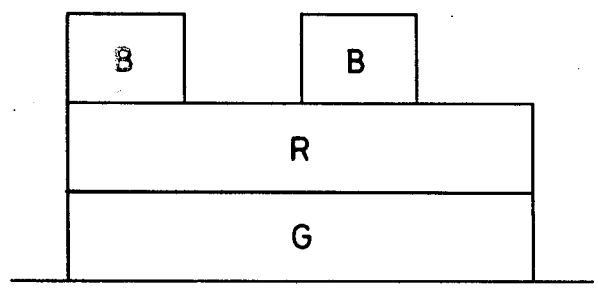
FIG. 4(b) and FIG. 4(c) are chart schematically showing intensity of primary color components of light obtained by the filter of FIG. 4(a).
Figure 4C:
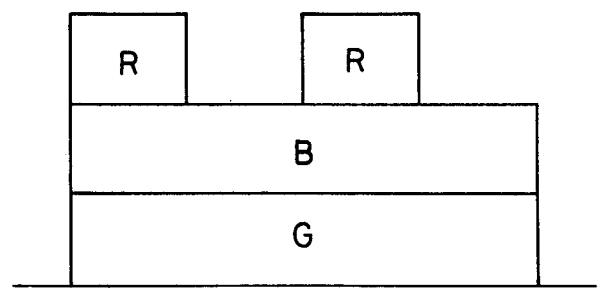

FIG. 4(b) and FIG. 4(c) respectively show positional distribution of component elementary colors of light contained in the incident light on the photoelectric elements passing through the yellow and transparent rows nH and (n+2)H and those through the cyanic and transparent rows (n+1)H and (n+3)H. That is to say, the yellow filter elements Ye in the rows nH and (n+2)H cut out only the blue color light and pass red and green color lights, and the cyanic filter elements in the rows (n+1)H and (n+3)H cut out only the red color light and pass blue and green color lights.

In FIG. 4(b), which shows the output of the rows nH, (n+2)H . . . , the blue components are modulated. In FIG. 4(c), which shows the output of the rows (n+1)H, (n+3)H . . . , the red components are modulated. Therefore, the output of the solid state CCD device comprises repetitions of the part for a horizontal row wherein blue components are modulated and the part for a horizontal row wherein red components are modulated. Accordingly the modulated blue component and red component of output of the CCD device 11 can be directly separated and taken out by use of a band pass filter of the cycle of the blue components and the red components.

Figure 5:
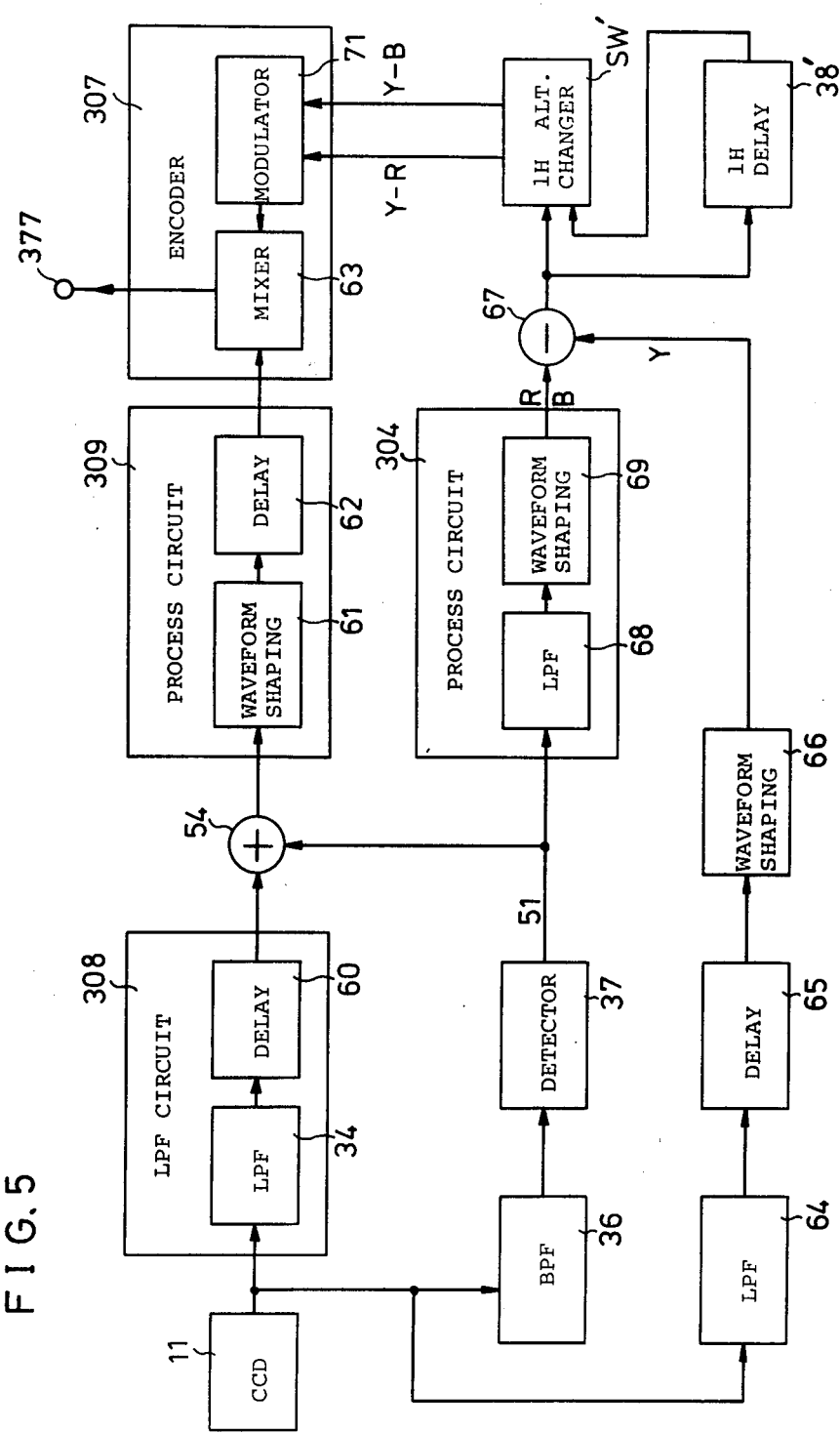
FIG. 5 is a block diagram of a first example of signal processing circuit for processing signals issued from the photoelectric device of FIG. 3(a).

As a circuit for processing the output signal of the CCD device 11, a circuit of FIG. 5 is used. In the circuit, the output signal of the CCD device 11 is led through a band pass filter 36 to a detector 37 wherefrom modulated R and B signals are alternately issued. Then the output from the detector 37 is given to a low pass filter 68 of the process circuit 304 and taken out through a waveform shaping circuit 69 to a subtractor circuit 67 to produce alternating R and B signals.

On the other hand the output of the CCD 11 is led through a low pass filter 34 to a delay circuit 60 which issues a quasi-luminance signal Y' which has a line crawling. Then, by receiving the output R or B from the detector 37 and adding it to the quasi-luminance signal Y' at an adder circuit 54, the line crawling is compensated and produce a luminance signal Y. The red and B signals may be added to the adder circuit 54 directly, but alternatively, they may be added after passing band width compensation circuit or band width limiting circuit in order for improvement of picture quality. Then the Y signal from the adder circuit 54 is led through a waveform shaping circuit 61 and a delay circuit 62 to a mixer 63 of an encoder 307. The band pass filter 36 has the center frequency of 3.58 MHz and band width of 1 MHz. The output 51 of the detector 37 has red signal and blue signal alternating every horizontal scanning periods. Therefore, utilizing resemblance of adjacent line signals, the color signal can be used as the color signal for the next line by delaying by one horizontal scanning period. The quasi-liminance signal is produced after passing the CCD output 50 to the low pass filter 34 of the cut off frequency of 3.58 MHz and, the line crawling of the quasi-luminance signal is compensated by adding the necessary color signal at the adder 54 thereby finishing a complete luminance signal. The output of the low pass filter 34 passes through the delay circuit 60, the adder (as line crawl compensation circuit) 54, waveform shaping circuit 61 and another delay circuit 62 and comes to a mixer 63. On the other hand, the CCD output 50 passes another low pass filter 64, another delay circuit 65, another waveform shaping circuit 66 and is given to a subtraction circuit 67. On the other hand, the output of the detector 37 passes through a low pass filter 68, and waveform shaping circuit 69 and is given to the subtraction circuit 67. Then, the output of the subtraction circuit 67 forms a first chrominance signal, and the signal from the same subtraction circuit 67 but taken out through a delay circuit 38' of one horizontal scanning period (1H) delay can be used as a second chrominance signal. Both the first and the second chrominance signal, namely, the output of the circuit 67 and the delay circuit 38' are alternatingly switched by an electronic switch SW' and the resultant output chrominance signals R-Y and B-Y are given to a balanced modulator 71, which modulate the chrominance signals with the carrier frequency of 3.58 MHz. The output of the modulator 71 is then given to the mixer to produce a composite standard video signal by additions of clamp pulse, composite blanking pulse, composite synchronizing pulse and burst signal.

Since the above-mentioned system uses a band pass filter for direct separation and outputting of chrominance signal, there is no use of complicated sampling technique as has been used in conventional chrominance signal separation circuit used for the system having R, G and B filters; and therefore the circuit is much simplified in comparison with such conventional circuit. Further, the luminance signal can be taken out directly through a low pass filter and no complicated circuit is necessary.

As the CCD device, a device using the interlace scanning is used in frame storing mode. The band pass filter has center frequency of 3.58 MHz and pass band width of 1 MHz. As the low pass filter, the cutoff frequency is 3.58 MHz.

The example embodying the present invention has satisfactory resolving power both in horizontal direction and in vertical direction, and sensitivity is also satisfactory. The above-mentioned resolving power in both the horizontal and vertical direction is deduced from uniform distribution by chequered disposition of the transparent parts W, and also uniform distributions of the two complementary color elements.

What is claimed is:
1. A solid state color imaging device comprising:
   a solid state photoelectric device,
   a color filter disposed in front of said solid state photoelectric device, said color filter has a number of minute filter elements of transparent parts, a first complementary color parts and a second complementary color parts, and
   a signal processing circuit for processing output signal of said solid state photoelectric device,
   said filter elements being disposed forming a number of parallel vertical columns and at the same time forming a number of horizontal rows, said vertical columns forming a sequence of said transparent part, said first complementary color part, said transparent part and said second complementary color part and repetition of the same, every two vertical columns having the same kinds of elements on the same horizontal row, and with regard to each other neighboring two vertical columns said transparent part neighbors with either said first complementary color part or said second complementary color part,
   thereby said transparent parts forming chequered disposition.
2. A solid state color imaging device in accordance with claim 1 wherein said first complementary color parts are cyanic and said second complementary color parts are yellow.
3. A solid state color imaging apparatus in accordance with claim 1, wherein said signal processing circuit comprises
   a separation circuit to analyze said output signals of said solid state photoelectric device (11) into a quasi-luminance signal and color signal.
   a composing circuit which adds said color signal (R,B) to said quasi-luminance signal (Y') thereby to finish said luminance signal (Y) without line crawling.
4. A solid state color imaging apparatus in accordance with claim 1, wherein both luminance information and color information are simultaneously and continuously issued from said solid state photoelectric device.
5. A solid state color imaging apparatus in accordance with claim 3, wherein said separation circuit comprises a low pass filter (34) which issues said quasi-luminance signal and, a band pass filter (36) and a delay circuit (38') which delays the Y-B or Y-R signal provided by substrator (67) for a time period of one horizontal line scanning.
6. A solid state color imaging apparatus in accordance with claim 3, which comprises a detector circuit having an output coupled to said composing circuit, and an adder circuit (54) which compensates line crawling of a luminance signal.
7. A solid state color imaging apparatus in accordance with claim 3, wherein said adding is always carried out continuously.

* * * * *